United States Patent
Jo et al.

(10) Patent No.: US 7,820,466 B2
(45) Date of Patent: Oct. 26, 2010

(54) FLAT PANEL DISPLAY DEVICE AND METHOD FOR MANUFACTURING THE SAME USING SEQUENTAL LATERAL SOLIDIFCATION AND SOLID PHASE CRYSTALLIZATION

(75) Inventors: Han-Na Jo, Cheongiu-si (KR); Chi-Woo Kim, Seoul (KR); Young-Jin Chang, Yongin-si (KR); Jae-Beom Choi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 192 days.

(21) Appl. No.: 11/781,518

(22) Filed: Jul. 23, 2007

(65) Prior Publication Data
US 2008/0026500 A1 Jan. 31, 2008

(30) Foreign Application Priority Data
Jul. 25, 2006 (KR) ...................... 10-2006-0069441

(51) Int. Cl.
 *H01L 21/00* (2006.01)
(52) U.S. Cl. .............................. 438/30; 438/82; 438/99; 438/166; 257/E29.273; 257/E51.001
(58) Field of Classification Search ................. 438/166, 438/149, 151, 30, 82, 99; 349/43, 151; 257/E29.273, 257/E51.001
See application file for complete search history.

(56) References Cited

U.S. PATENT DOCUMENTS

| 6,300,175 | B1 * | 10/2001 | Moon | 438/158 |
| 2004/0087064 | A1 * | 5/2004 | Lee | 438/128 |
| 2004/0263703 | A1 * | 12/2004 | You | 349/42 |
| 2004/0266078 | A1 * | 12/2004 | Kim | 438/166 |
| 2005/0105037 | A1 * | 5/2005 | Kim et al. | 349/151 |
| 2005/0173709 | A1 * | 8/2005 | Lee et al. | 257/79 |
| 2006/0003505 | A1 * | 1/2006 | Hwang et al. | 438/151 |
| 2006/0105486 | A1 * | 5/2006 | Lee et al. | 438/30 |
| 2006/0152151 | A1 * | 7/2006 | Seo | 313/506 |

FOREIGN PATENT DOCUMENTS

| JP | 2000-029068 | 1/2000 |
| KR | 1020060001711 | 1/2006 |
| KR | 1020060001718 | 1/2006 |

* cited by examiner

*Primary Examiner*—Thanh V Pham
*Assistant Examiner*—Duy T Nguyen
(74) *Attorney, Agent, or Firm*—F. Chau & Associates, LLC

(57) ABSTRACT

A flat panel display device includes a substrate including a pixel area having a plurality of pixel parts and a peripheral circuit area disposed adjacent to the pixel area to drive the pixel parts, a circuit TFT disposed in the peripheral circuit area, the circuit TFT including a first semiconductor layer having a first crystal growth in a lateral direction, and a pixel TFT disposed in the pixel area, the pixel TFT including a second semiconductor layer having a second crystal isotropic growth.

10 Claims, 14 Drawing Sheets

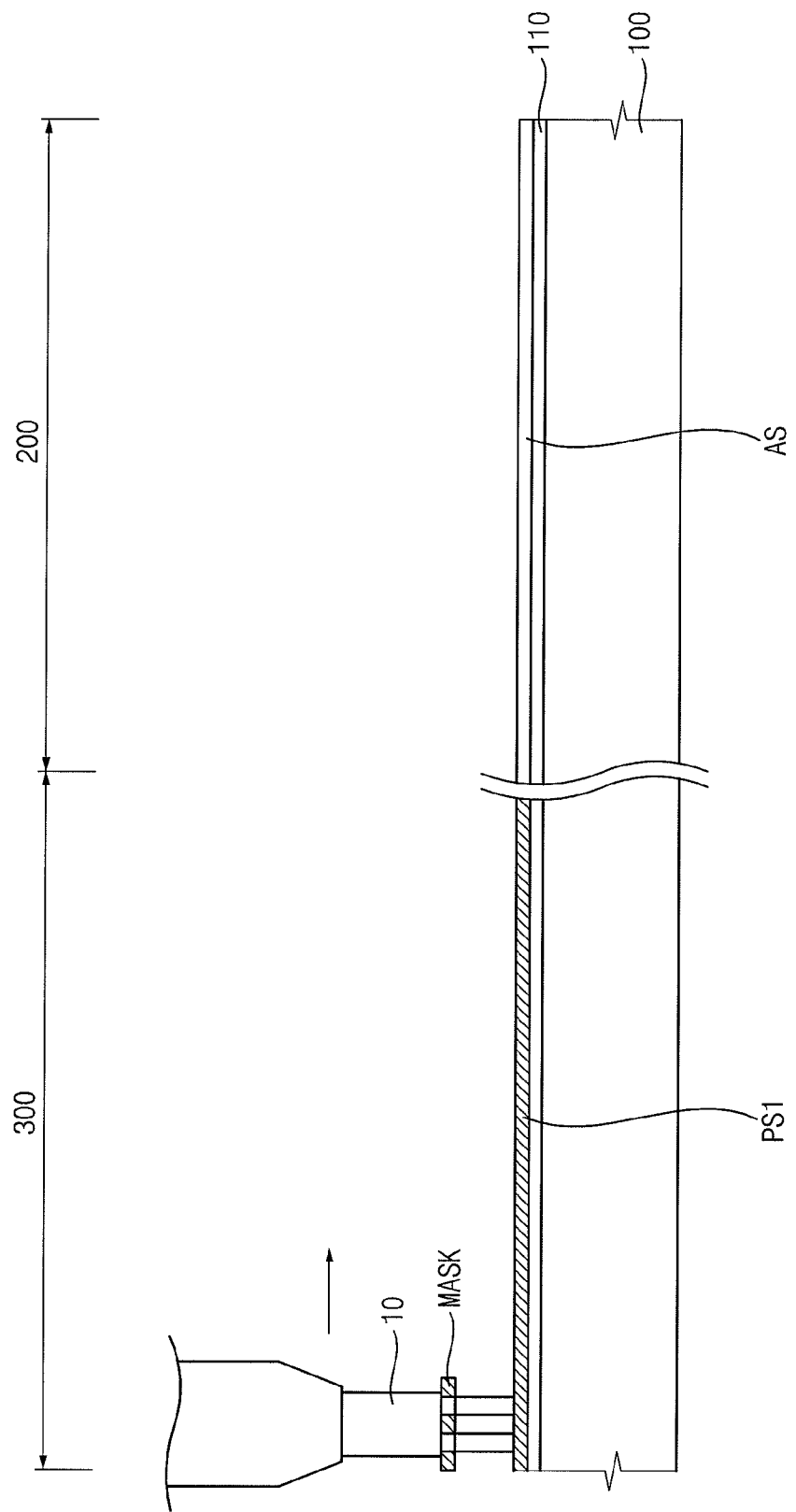

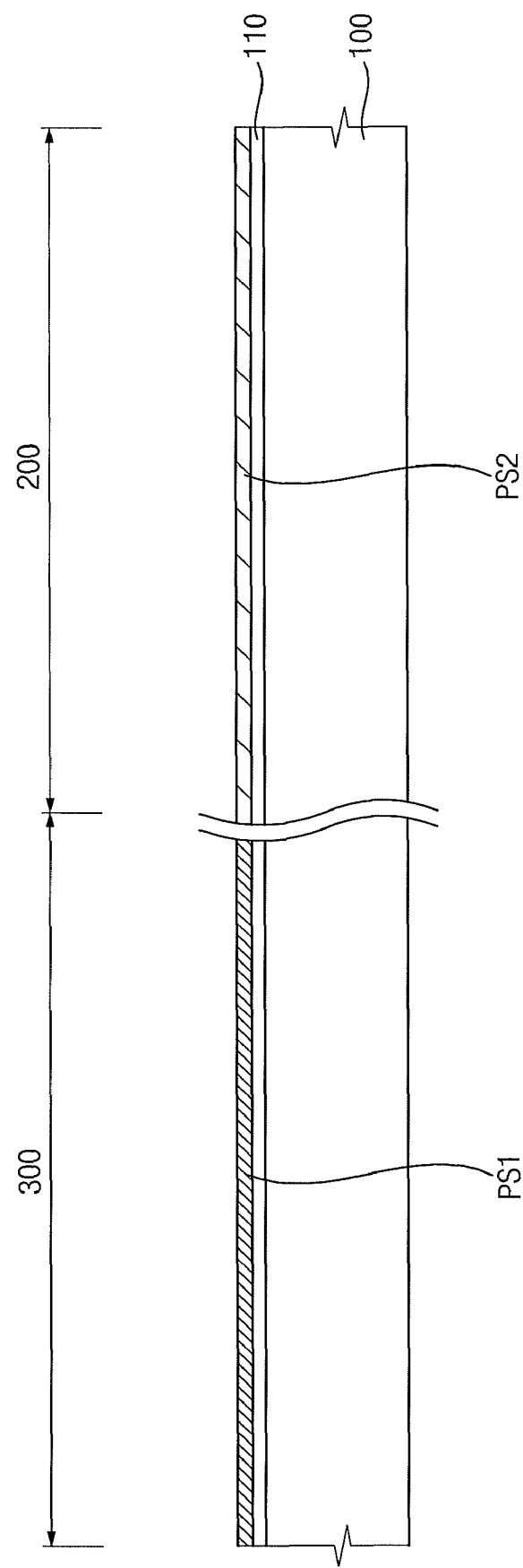

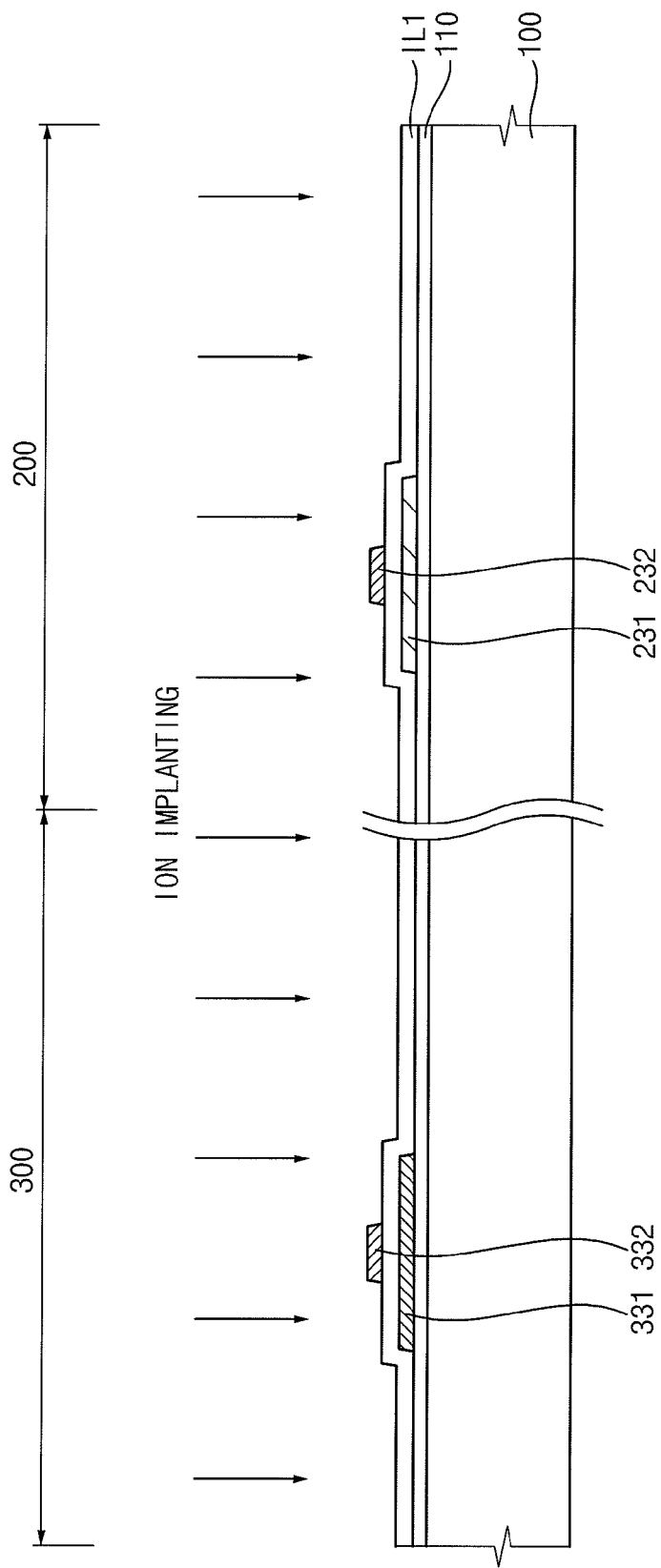

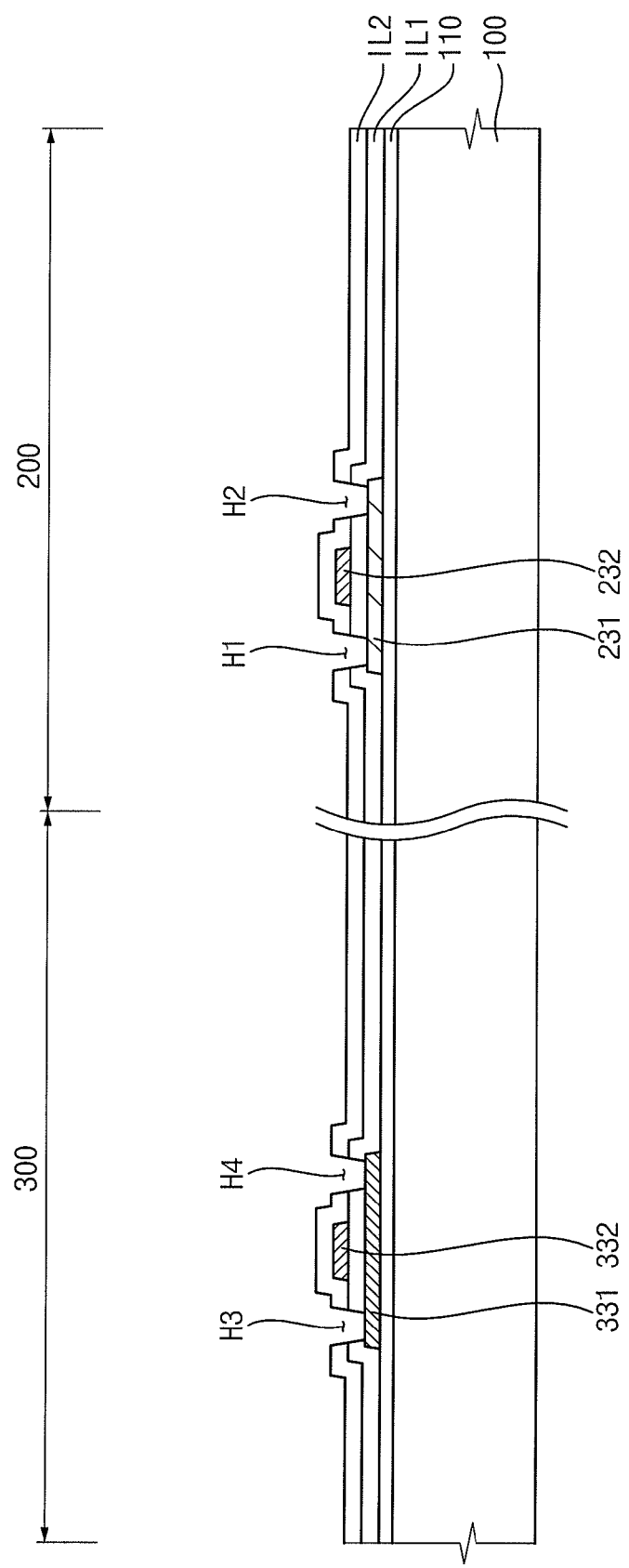

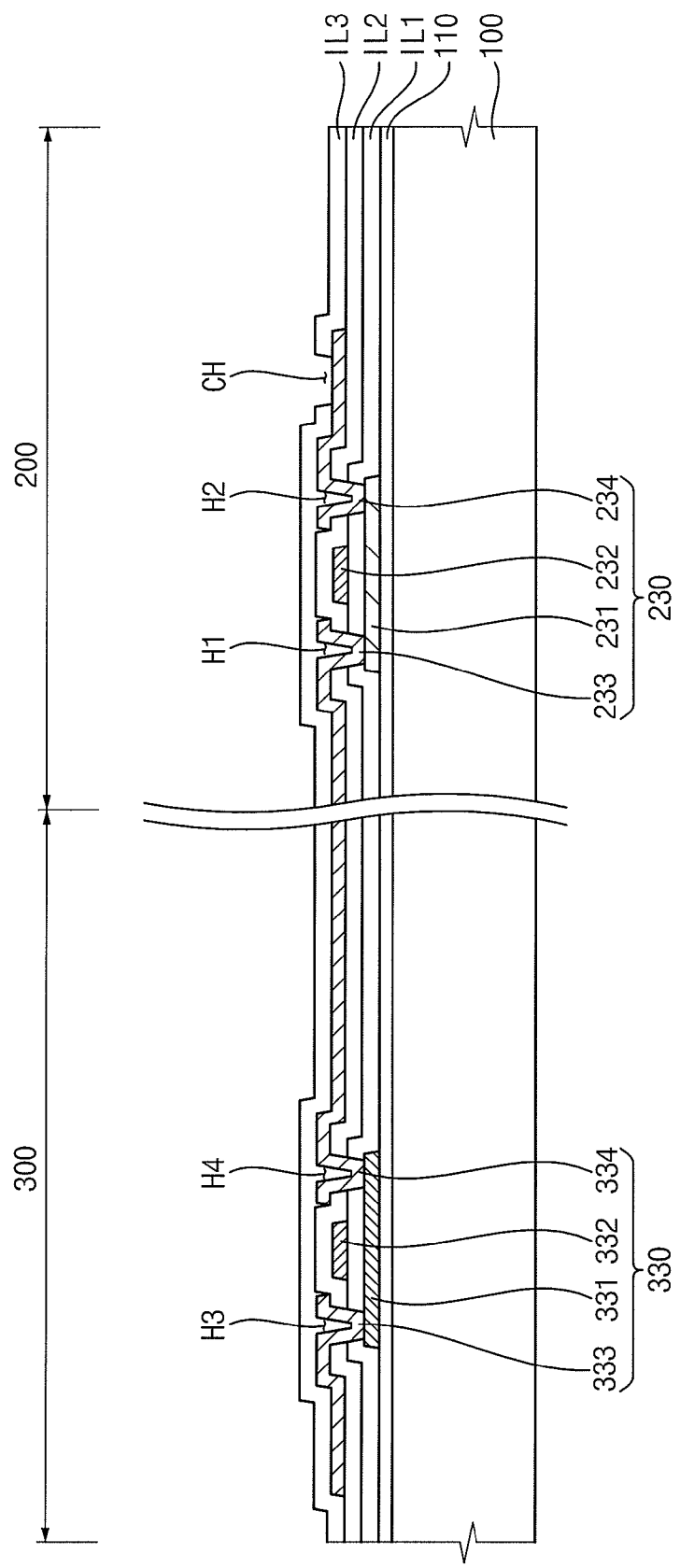

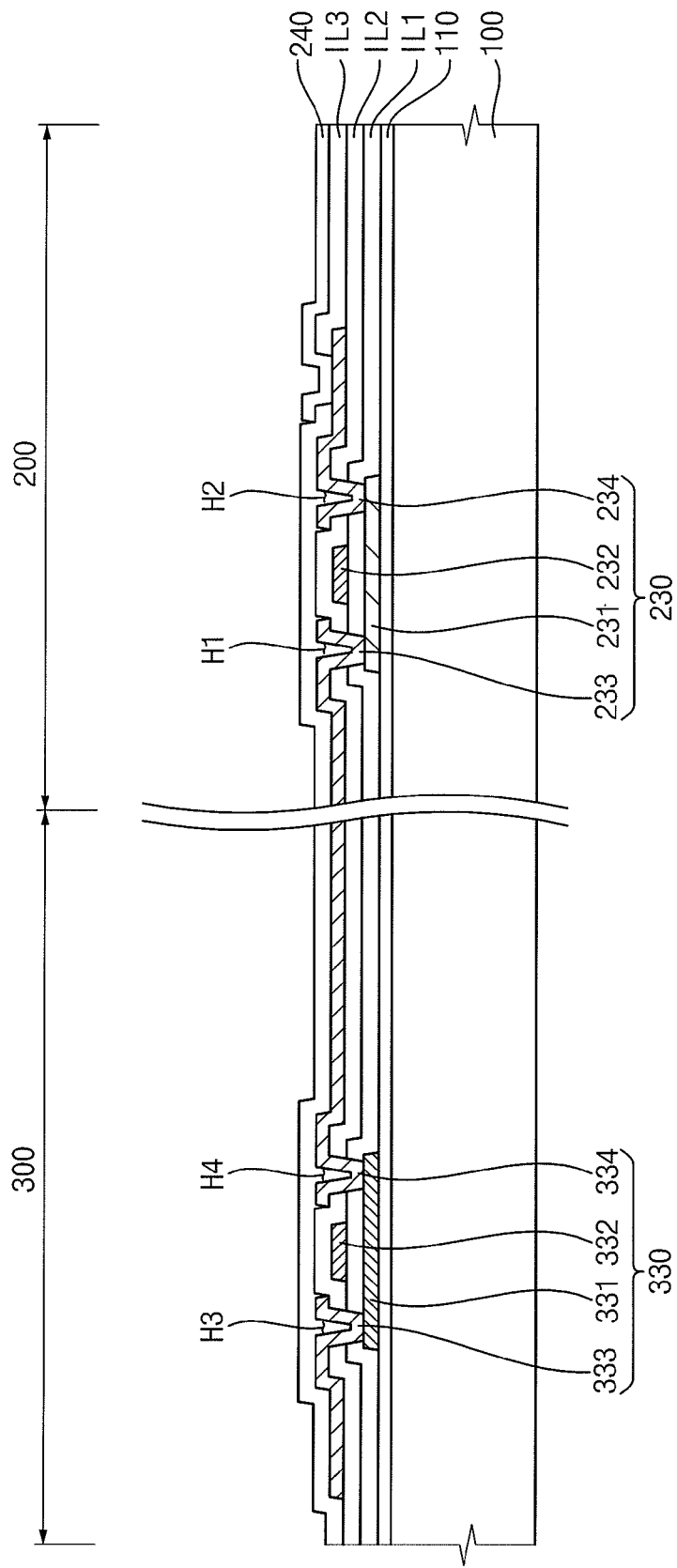

FLAT PANEL DISPLAY DEVICE AND METHOD FOR MANUFACTURING THE SAME USING SEQUENTAL LATERAL SOLIDIFCATION AND SOLID PHASE CRYSTALLIZATION

CROSS-REFERENCE TO RELATED APPLICATION

The present application claims priority under 35 U.S.C. §119 to Korean Patent Application No. 2006-069441, filed on Jul. 25, 2006, the disclosure of which is incorporated herein by reference.

BACKGROUND OF THE INVENTION

1. Technical Field

The present disclosure relates to a flat panel display device and a method of manufacturing the flat panel display device, and more particularly, to a flat panel display device capable of optimizing driving characteristics of a circuit thin film transistor and a pixel thin film transistor.

2. Discussion of the Related Art

A flat panel display device may include a liquid crystal display (LCD) device, a plasma display panel (PDP), a field emission display (FED) and an electro luminescence display (ELD). The flat panel display device includes a pixel area having a plurality of pixel parts and a circuit area positioned adjacent the pixel area. The pixel area includes pixel thin film transistors (TFTs) to drive each of the pixel parts. The circuit area includes circuit TFTs to control driving signals applied to the pixel area.

Driving characteristics of the pixel TFT and the circuit TFT are different. For example, an image is displayed on the pixel area. Thus, to display a uniform image on the pixel area, a uniform driving characteristic for the pixel TFT throughout the pixel area is needed. Since the peripheral circuit area receives complicated driving signals, the circuit TFT requires fast response time to control the driving signals.

Thus, when channels of the pixel and circuit TFTs are formed with semiconductor layers of a same material, each distinct driving characteristic of the pixel TFT and the circuit TFT may not be achieved.

SUMMARY OF THE INVENTION

Exemplary embodiments of the present invention provide a flat panel display device capable of optimizing driving characteristics of a circuit thin film transistor and a pixel thin film transistor and a method of manufacturing the flat panel display device.

According to an exemplary embodiment of the present invention, a method of manufacturing a flat panel display device includes forming a semiconductor layer including amorphous silicon on a substrate having a pixel area and a peripheral circuit area surrounding the pixel area, first crystallizing the semiconductor layer formed on the peripheral circuit area through a sequential lateral solidification (SLS) process, second crystallizing the semiconductor layer formed on the peripheral circuit area and the pixel area through a solid phase crystallization (SPC) process, forming a circuit thin film transistor (TFT) including the semiconductor layer crystallized by the first and second crystallizing, the circuit TFT formed in the peripheral circuit area and forming a pixel TFT including the semiconductor layer crystallized by the second crystallizing, the pixel TFT formed in the pixel area, and forming a first electrode connected to the pixel TFT.

The second crystallizing can be performed after the first crystallizing. The first crystallizing can be performed after the second crystallizing.

The method of manufacturing the flat panel display device may further include forming an organic light emitting layer on the first electrode, and forming a second electrode on the organic light emitting layer to correspond to the pixel area.

The pixel area may include a plurality of pixel parts and the first electrode can correspond to each of the pixel parts.

The first crystallizing using the SLS process may include irradiating a laser beam onto a slit mask corresponding to a first portion of the peripheral circuit area to crystallize a portion of the semiconductor layer, shifting the slit mask at a predetermined distance in the peripheral circuit area, and irradiating a laser beam onto the shifted slit mask to crystallize a second portion of the peripheral circuit area.

The second crystallizing using the SPC process can be performed at a heat-treatment temperature in a range of from about 600° C. to about 1000° C.

The method of manufacturing the flat panel display device may further include forming a color filter between the pixel TFT and the first electrode.

The method of manufacturing the flat panel display device may further include coupling a countering substrate with the substrate, and injecting a liquid crystal layer between the substrate and the countering substrate.

The method of manufacturing the flat panel display device may further include forming a common electrode on the countering substrate.

According to an exemplary embodiment of the present invention, a flat panel display device includes a substrate including a pixel area having a plurality of pixel parts and a peripheral circuit area disposed adjacent to the pixel area to drive the pixel parts, a circuit TFT disposed in the peripheral circuit area, the circuit TFT including a first semiconductor layer having a first crystal growth in a lateral direction, and a pixel TFT disposed in the pixel area, the pixel TFT including a second semiconductor layer having a second crystal isotropic growth.

The first semiconductor layer may comprise poly silicon crystallized by a SLS process and a SPC process.

The second semiconductor layer may comprise poly silicon crystallized by the SPC process.

The flat panel display device may further include an insulation layer formed the circuit TFT and the pixel TFT, a first electrode formed on the insulation layer corresponding to each of the pixel parts, the first electrode connected to the pixel TFT, an organic light emitting layer formed on the first electrode, and a second electrode formed on the organic light emitting layer corresponding to the pixel area.

The flat panel display device may further include a sealing member corresponding to the pixel area, the sealing member disposed on the second electrode.

The peripheral circuit area may include a gate driving circuit part integrated in the substrate. The peripheral circuit area may comprise a data driving circuit part integrated in the substrate.

The flat panel display device may further include a protection layer formed under the circuit TFT and the pixel TFT

BRIEF DESCRIPTION OF THE DRAWINGS

Exemplary embodiments of the present invention can be understood in more detail from the following descriptions taken in conjunction with the accompanying drawings, in which:

FIGS. 3A to 3K are cross-sectional views showing a method of manufacturing a flat panel display device according to an exemplary embodiment of the present invention.

DESCRIPTION OF EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein.

Figure 1:
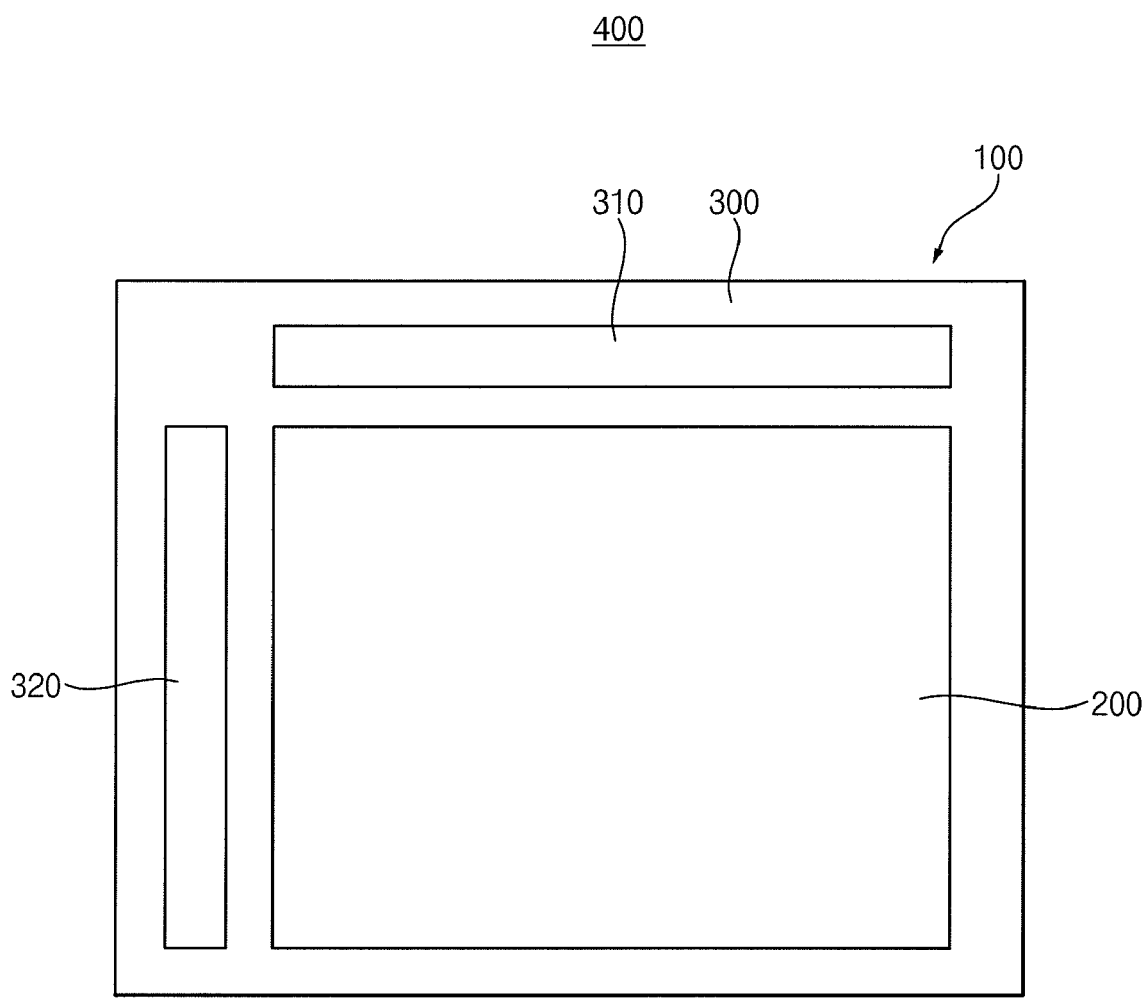
FIG. 1 is a plan view showing a flat panel display device according to an exemplary embodiment of the present invention.

FIG. 1 is a plan view showing a flat panel display device according to an exemplary embodiment of the present invention.

Referring to FIG. 1, an organic emission device 400 includes a substrate 100. The substrate 100 includes a pixel area 200 having a plurality of pixel parts to display an image and a peripheral circuit area 300 positioned adjacent to the pixel area 200.

The plurality of pixel parts may be formed in a matrix, each of the pixel parts includes a pixel thin film transistor (TFT) connected to a gate line and a data line.

The substrate 100 corresponding to the peripheral circuit area 300 may include a gate driving circuit part 310 to drive the plurality of pixel parts and a data driving circuit part 320. The gate driving circuit part 310 and the data driving circuit part 320 include circuit TFTs. In an exemplary embodiment, the gate driving circuit part 310 and the data driving circuit part 320 may be integrated on the substrate 100.

Driving characteristics required for the pixel TFT and the circuit TFT may be different. The circuit TFT to control driving signals for driving the pixel area 200 requires fast response time. Thus, the circuit TFT requires high electronic mobility.

To maintain uniform display quality in the pixel area 100 where an image displayed, the pixel TFT requires a uniform and stable threshold voltage Vth throughout the pixel area 100.

To satisfy the driving characteristics for the circuit TFT and the pixel TFT, semiconductor layers crystallized by a different crystallization process can be employed for the circuit TFT and the pixel TFT according to an exemplary embodiment of the present invention.

Figure 2:
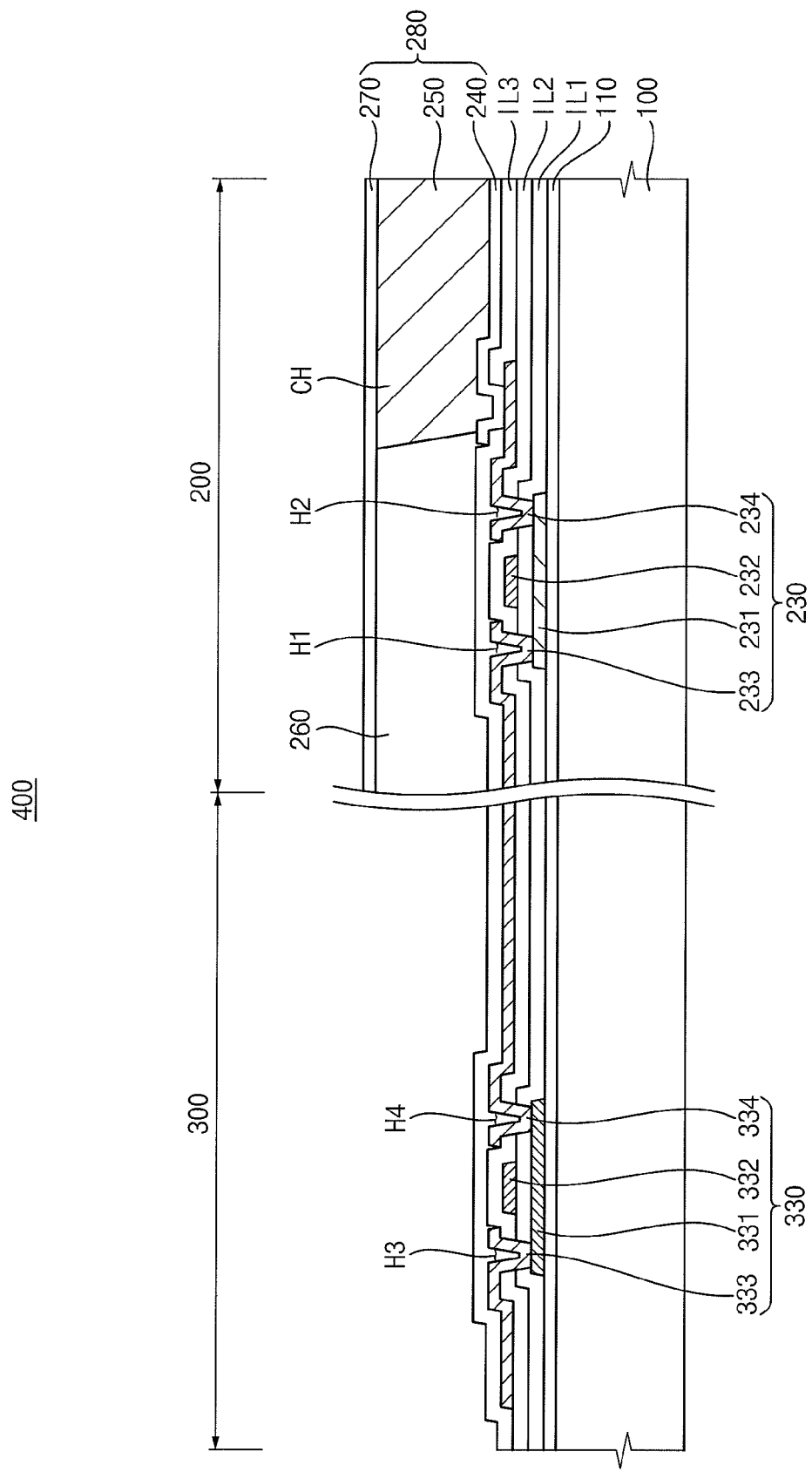
FIG. 2 is a cross-sectional view showing a flat panel display device according to an exemplary embodiment of the present invention.

FIG. 2 is a cross-sectional view showing a flat panel display device according to an exemplary embodiment of the present invention. FIG. 2 illustrates a portion of the peripheral circuit area 300 and a single pixel part of the pixel area 200.

A blocking layer 110 is formed on the substrate 100. The blocking layer 110 may prevent impurities of the substrate 100 from escaping while a high temperature process is performed. The blocking layer 110 may include, for example, silicon oxide $SiO_2$.

A pixel TFT 230 is formed on the blocking layer 110 corresponding to the pixel area 200. A circuit TFT 330 is formed on the blocking layer 110 corresponding to a portion of the peripheral circuit area 300.

The pixel TFT 230 includes a first semiconductor layer 231, a first gate electrode 232, a first source electrode 233 and a first drain electrode 234.

The first semiconductor layer 231 may include, for example, polysilicon crystallized through a solid phase crystallization (SPC) process. In the SPC process, amorphous silicon is heat-treated at a heat-treatment temperature which is from about 600° C. to about 800° C. during from hours to dozens of hours.

The size of a crystal grain crystallized by the SPC process may vary according to a heating temperature and a heating time. In an exemplary embodiment, the size of a crystal grain can be several micrometers (μm).

Since the polysilicon crystallized by the SPC process may have uniform electron mobility, an image can be displayed uniformly throughout the pixel area 200 by using the first semiconductor layer 231 as a channel of the pixel TFT 230.

A first insulation layer IL1 is formed on the blocking layer 110 where the first semiconductor layer 231 is formed. The first insulation layer IL1 may include, for example, silicon nitride SiNx or silicon oxide $SiO_2$.

The first gate electrode 232 is connected to the gate line. The first gate electrode 232 is formed on the first insulation layer IL1 and overlapping a portion of the first semiconductor layer 231.

Ions are implanted into both end portions of the first semiconductor layer 231. The ions are implanted for the first source electrode 233, the first drain electrode 234 and an ohmic contact of the first semiconductor layer 231. The ions may include, for example, an n-type ion or a p-type ion.

A second insulation layer IL2 is formed on the first insulation layer IL1 where the first gate electrode 232 is formed. The second insulation layer IL2 may include, for example, silicon nitride SiNx or silicon oxide $SiO_2$.

First and second holes H1, H2 are formed in the first and second insulation layers IL1 and IL2 to expose both end portions of the first semiconductor layer 231.

The first source electrode 233 is connected to the data line, and is formed on the second insulation layer IL2. The first source electrode 233 is connected to the first semiconductor layer 231 through the first hole H1.

The first drain electrode 234 is disposed apart from the first source electrode 233, and is formed through the second insulation layer IL2. The first drain electrode 234 is connected to the first semiconductor layer 231 through the second hole H2.

Since the ions are implanted into the first semiconductor layer 231 where a portion of the first semiconductor layer 231 is exposed by the first and second holes H1, H2, the first source and drain electrodes 233, 234 may be in ohmic contact with the first semiconductor layer 231.

A third insulation layer IL3 is formed on the second insulation layer IL2 where the first source electrode 233 and the first drain electrode 234 are formed.

The third insulation layer IL3 may include, for example, silicon nitride SiNx or silicon oxide $SiO_2$.

A contact hole CH is formed in the third insulation layer IL3 to expose a portion of the first drain electrode 234.

A first electrode 240 corresponding to each of the pixel parts is formed on the third insulation layer IL3. The first electrode 240 may include, for example, a conductive material or a transparent conductive material. The first electrode 240 is electrically connected to the first drain electrode 234 through the contact hole CH. When the pixel TFT 230 is turned on, the first electrode 240 receives a pixel voltage from the first drain electrode 234.

A color filter (not shown) corresponding to each of the pixel parts may be formed between the first electrode 240 and the third insulation layer IL3.

An organic light emitting layer 250 is formed on the first electrode 240.

The organic light emitting layer 250 may include a hole injection layer, a hole transferring layer, a light emitting layer, an electron injection layer and an electron transferring layer. The organic light emitting layer 250 is formed in a light emitting area divided by a bank part 260.

A second electrode 270 corresponding to the pixel area 200 is formed on the organic light emitting layer 250. The second electrode 270 may include, for example, a conductive material or a transparent conductive material. In an exemplary embodiment, when the first electrode 240 includes a metallic material, the second electrode 270 may include a transparent conductive material. In an exemplary embodiment, when the first electrode 240 includes a transparent conductive material, the second electrode 270 may include a conductive metallic material.

The second electrode 270 applies an electric current to the organic light emitting layer 250 with the first electrode 240.

In an exemplary embodiment, the first electrode 240 functions as an anode to inject a hole to the organic emitting layer 250, the second electrode 270 functions as a cathode to inject an electron to the organic emitting layer 250.

The electron and the hole injected from the first electrode 240 and the second electrode 270 are combined at the organic light emitting layer 250, and then form an exciton.

The exciton drops down to the ground level, thereby emitting light. The light is passed through the first and second electrode 240, 270 and displays an image.

An organic light emitting diode 280 may include the first electrode 240, the organic light emitting layer 250 and the second electrode 270 to generate light.

A protection layer (not shown) may be formed on the second electrode 270 to protect the organic light emitting layer 250 and the second electrode 270 from moisture or oxygen. The protection layer may be formed throughout the pixel area 200. The protection layer may include, for example, an organic layer or an inorganic layer.

In an exemplary embodiment, an additional substrate may be coupled with the substrate 100 corresponding to the pixel area 200, thereby sealing thin films formed on the substrate 100.

The circuit TFT 330 formed on the peripheral circuit area 300 may include a second semiconductor layer 331, a second gate electrode 332, a second source electrode 333 and a second drain electrode 334.

The second semiconductor layer 331 includes polysilicon crystallized through a sequential lateral solidification (SLS) process and a SPC process. In an exemplary embodiment, the second semiconductor layer 331 may include polysilicon crystallized only through the SLS process.

The energy per unit area provided by the SLS process is greater than the energy per unit area provided by the SPC process. When the SLS process and the SPC process are sequentially performed, a crystal grain size is substantially the same as the crystal grain size formed only by the SLS process. Therefore, an electric characteristic of polysilicon formed by both the SLS process and the SPC process is substantially similar to an electric characteristic of polysilicon formed only by the SLS process.

The crystal grains of the second semiconductor layer 331 crystallized by the SLS process may have fewer crystalline defects than crystal grains of polysilicon crystallized by the SPC process. Since the crystal grains grow in a predetermined direction, the second semiconductor layer 331 may have excellent electron mobility. Thus, the second semiconductor layer 331 may have higher electron mobility than the first semiconductor layer 231 crystallized by the SPC process.

The circuit TFT 330 can improve response time by using the second semiconductor layer 331 as a channel of the circuit TFT 330. Since the response time of the circuit TFT 330 is enhanced by using the polysilicon crystallized by the SLS process as the second semiconductor layer 331, system on glass (SOG) technology can be employed in the flat panel display device by directly forming the gate and data driving circuits which receive complicated driving signals on the substrate 100.

The SLS process shown in FIG. 3B is performed on a portion of the substrate 100. When the SLS process is performed on a large-sized substrate, a crystalline characteristic in an area where a laser beam is irradiated may be different from a crystalline characteristic in an area where a laser beam is irradiated.

In an exemplary embodiment, the second semiconductor layer 331 crystallized by the SLS process is employed for the circuit TFT 330, and the first semiconductor layer 231 crystallized by the SPC process is employed for the pixel TFT. Thus, driving characteristics and image quality of the flat panel display device can be improved.

The first insulation layer IL1 is formed on the second semiconductor layer 331. The second gate electrode 332 is formed on the first insulation layer IL1, and overlaps a portion of the second semiconductor layer 331. The second insulation layer IL2 is formed on the second gate electrode 332.

Third and fourth holes H3, H4 are formed in the first and second insulation layer IL1, IL2 to expose both end portions of the second semiconductor layer 331.

The second source electrode 333 is formed on the second insulation layer IL2, and is connected to the second semiconductor layer 331 through the third hole H3.

The second drain electrode 334 is disposed apart from the second source electrode 333 and is formed through the second insulation layer IL2. The second drain electrode 334 is connected to the second semiconductor layer 331 through the fourth hole H4.

The second gate electrode 332, the second source electrode 333 and the second drain electrode 334 may be connected to the circuit lines of the gate driving circuit part 310 or the data driving circuit part 320. The second drain electrode 334 may be a source electrode or a gate electrode of a different circuit TFT.

Since the ions are implanted into the second semiconductor layer 331 where a portion of the second semiconductor layer 331 is exposed by the third and fourth holes H3, H4, the second source and second drain electrodes 333, 334 may be in ohmic contact with the second semiconductor layer 331. The third insulation layer IL3 is formed on the circuit TFT 330.

FIGS. 3A to 3K are cross-sectional views showing a method of manufacturing a flat panel display device according to an exemplary embodiment of the present invention.

Figure 3A:
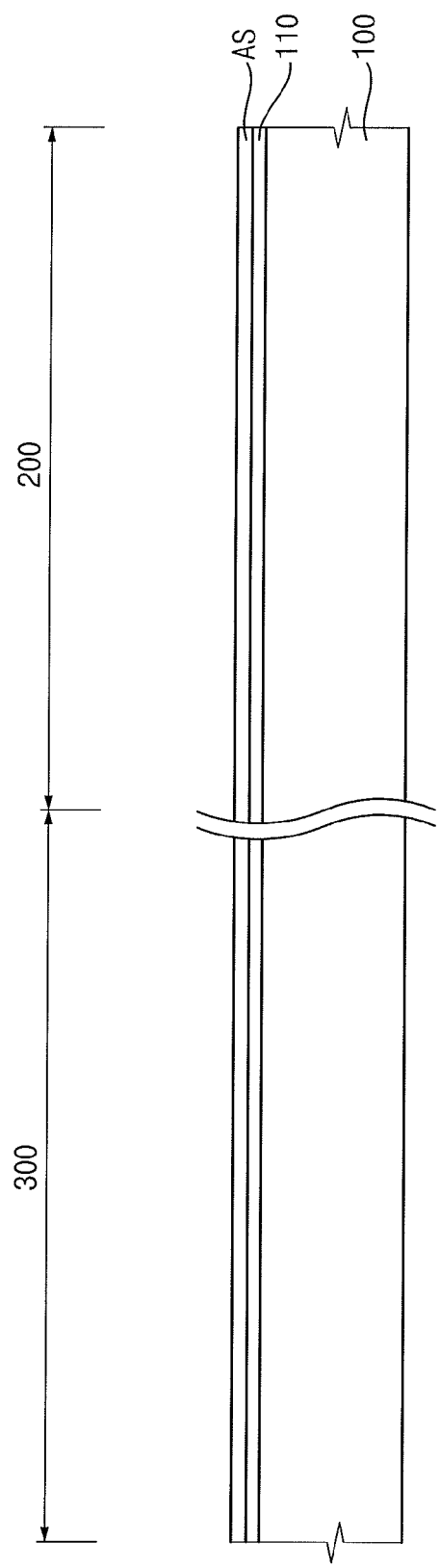

Referring to FIG. 3A, the blocking layer 110 is formed on the substrate 100 including a pixel area 200 to display an image and a peripheral circuit area 300. The blocking layer 110 may prevent impurities of the substrate 100 from escaping during a high temperature process. The blocking layer 110 may include, for example, silicon oxide SiOx. The blocking layer 110 may be formed by a chemical vapor deposition (CVD) process.

Amorphous silicon AS is formed on the blocking layer 110. The amorphous silicon may be formed by, for example, the CVD process.

Referring to FIGS. 3A to 3B, the amorphous silicon AS corresponding to the peripheral circuit area 300 is crystallized by a first crystallization process. The first crystallization process can be the SLS process.

In the SLS process, a silicon crystallization mask with a slit is positioned on the amorphous silicon of the peripheral circuit area 300, and a laser beam 10 is irradiated onto the silicon crystallization mask.

The amorphous silicon irradiated by the laser beam 10 is melted, and then solidified.

A first scan is performed by repeatedly shifting the silicon crystallization mask from a first end portion of the substrate 100 to a second end portion of the substrate 100 by a predetermined distance. The laser beam 10 passing through the slit of the silicon crystallization mask is irradiated on the substrate 100 from a first end portion of the substrate 100 to a second end portion of the substrate 100.

After the first scan is completed, the silicon crystallization mask is shifted in a vertical direction perpendicular to the scan direction by a predetermined distance. The laser beam 10 irradiating onto the substrate 100 is shifted in the vertical direction perpendicular to the scan direction by a predetermined distance. In an exemplary embodiment, a shifting distance of the silicon crystallization mask may be about half of the slit width.

A second scan is performed by repeatedly shifting the silicon crystallization mask from a first end portion of the substrate 100 to a second end portion of the substrate 100 by a predetermined distance. The laser beam 10 passing through the slit of the silicon crystallization mask is irradiated on the substrate 100 from the first end portion of the substrate 100 to the second end portion of the substrate 100.

After the second scan is completed, the silicon crystallization mask is shifted in a vertical direction perpendicular to the scan direction by a predetermined interval. The laser beam 10 irradiating the substrate 100 is shifted in the vertical direction perpendicular to the scan direction by a predetermined interval.

The laser beam 10 passing through the silicon crystallization mask is shifted on the substrate 100, so that the amorphous silicon formed on the peripheral circuit area 300 is crystallized in a first crystallization.

A first polysilicon layer PS1 where a crystal grain grows in a lateral direction by the first crystallization is formed on the peripheral circuit area 300.

Referring to FIG. 3C, the first polysilicon layer PS1 formed on the peripheral circuit area 300 and the amorphous silicon AS formed on the pixel area 200 are crystallized by the SPC process in a second crystallization.

In an exemplary embodiment, the substrate 100 having the first polysilicon layer PS1 and the amorphous silicon AS is heat-treated at a high temperature from about 600° C. to about 800° C. The second crystallization can be performed at a temperature from about 750° C. to about 780° C.

The first polysilicon layer PS1 formed through the first and second crystallization is formed on the peripheral circuit area 300, and the second poly silicon layer PS2 formed only through the second crystallization is formed in the pixel area 200.

Since the first polysilicon layer PS1 and the second polysilicon layer PS2 are crystallized by different crystallization processes, a size of crystal grain, crystallinity, electron mobility, and a growing direction of the crystal grain are different from each other.

The energy per unit area provided by the SLS process is greater than the energy per unit area provided by the SPC process. When the SLS process and the SPC process are sequentially performed, a crystal grain size is substantially the same as a crystal grain size formed by only the SLS process. Therefore, an electric characteristic of polysilicon formed by both the SLS process and the SPC process is substantially similar to an electric characteristic of polysilicon formed only by the SLS process.

In the SLS process, amorphous silicon is melted by a laser beam, and then crystallized. Thus, the crystal grain grows in a lateral direction and polysilicon may have excellent crystallinity. The electron mobility of the first polysilicon layer PS1 crystallized by the SLS process is higher than that of the second polysilicon layer PS2 crystallized by the SPC process.

Thermal energy applied to the substrate 100 generates a crystal nucleus, and the crystal nucleus grows. Thus, a crystal grain of the second polysilicon layer PS2 may grow non-directionally and istropically. The electron mobility of the second polysilicon layer PS2 is uniform throughout the pixel area 200.

Figure 3D:
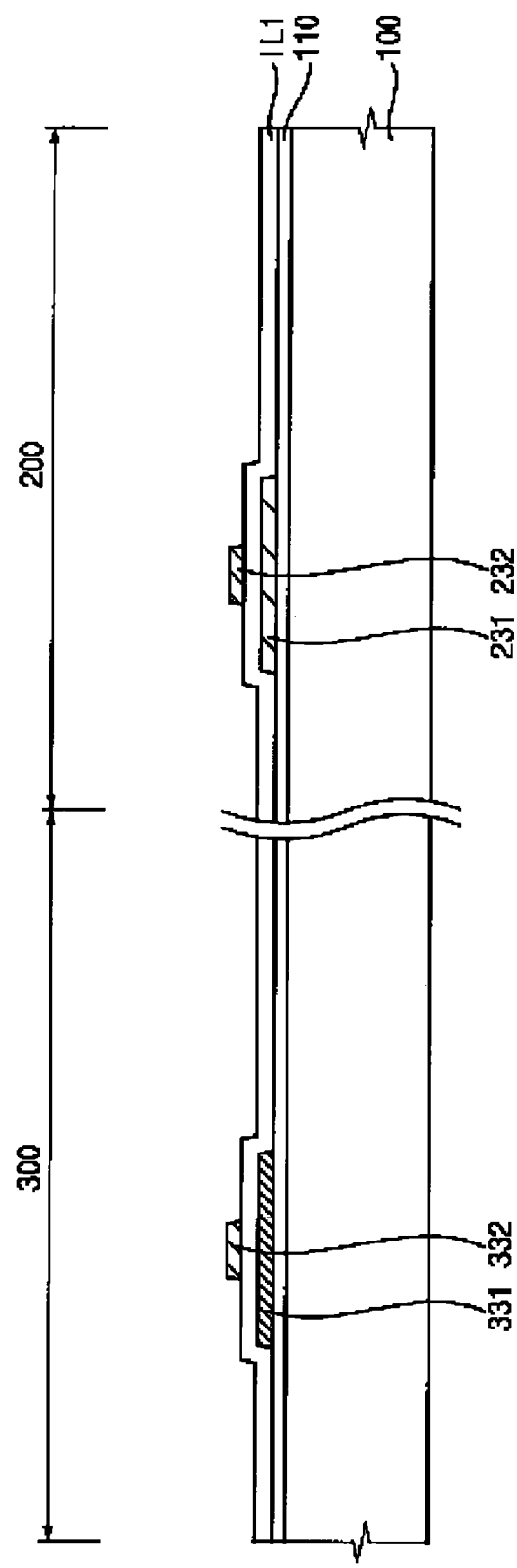

Referring to FIGS. 3C to 3D, a photoresist is coated on the first and second polysilicon layers PS1, PS2. A photoresist pattern (not shown) is formed by patterning the photoresist through a photolithography process having exposure and developing processes.

The photoresist pattern functions as an etching mask so that the first and second polysilicon layers PS1, PS2 are patterned through an etching process using the etching mask.

The first semiconductor layer 231 having the second polysilicon layer PS2 is formed on the pixel area 200. The second semiconductor layer 331 having the first polysilicon layer PS1 is formed on the peripheral circuit area 300.

The first insulation layer IL1 is formed on the blocking layer 110 where the first and second semiconductor layers 231, 331 are formed. In an exemplary embodiment, the first insulation layer IL1 may include, for example, silicon nitride SiNx or silicon oxide SiOx. The first insulation layer IL1 may be formed by the CVD process.

A metal layer (not shown) is formed on the first insulation layer IL1. The metal layer is patterned through lithography and etching processes, so that a gate metal pattern including the first gate electrode 232 and the second gate electrode 332 is formed. The gate metal pattern may include a plurality of gate lines formed on the pixel area 200 and a plurality of circuit lines formed on the peripheral circuit area 300.

The first gate electrode 232 is connected to the gate line formed in the pixel area 200. The second gate electrode 332 is connected to the circuit line formed in the peripheral circuit area 300.

The first gate electrode 232 is formed on the first insulation layer IL1, and overlaps a portion of the first semiconductor layer 231. The second gate electrode 332 is formed on the first insulation layer IL1, and overlaps a portion of the second semiconductor layer 331. In an exemplary embodiment, each of the first and second gate electrodes 232, 332 has an area smaller than that of the first and second semiconductor layers 231, 331.

Referring to FIG. 3E, ions are implanted into the substrate 100 where the first and second gate electrodes 232, 332 are formed. The ions may be an n-type ion or a p-type ion.

The first and second gate electrodes 232, 332 may include, for example, a metal. The ions implanted into the substrate 100 are not implanted under the first and second gate electrodes 232, 332. The ions are implanted into a non-overlapped area of the first and second semiconductor layers 231, 331 which does not overlap the first and second gate electrodes 232, 332.

Referring to FIG. 3F, the second insulation layer IL2 is formed on the first insulation layer IL1 where the first and second gate electrodes 232, 332 are disposed. In an exemplary embodiment, the second insulation layer IL2 may include, for example, silicon nitride SiNx or silicon oxide SiOx. The second insulation layer IL2 may be formed by the CVD process.

The first, second, third and fourth holes H1, H2, H3 and H4 are formed by patterning the first and second insulation layers IL1, IL2 at the same time through photolithography and etching processes.

The first hole H1 is formed adjacent a first side of the first gate electrode 232. The second hole H2 is formed adjacent to a second side of the first gate electrode 232 to expose the first semiconductor layer 231.

The third and fourth holes H3, H4 are formed at substantially same positions with respect to the second gate electrode 332 to expose the second semiconductor layer 331. A semiconductor layer exposed by the first, second, third and fourth holes H1, H2, H3 and H4 may be an area where the ions are implanted through an ion doping process.

Figure 3G:
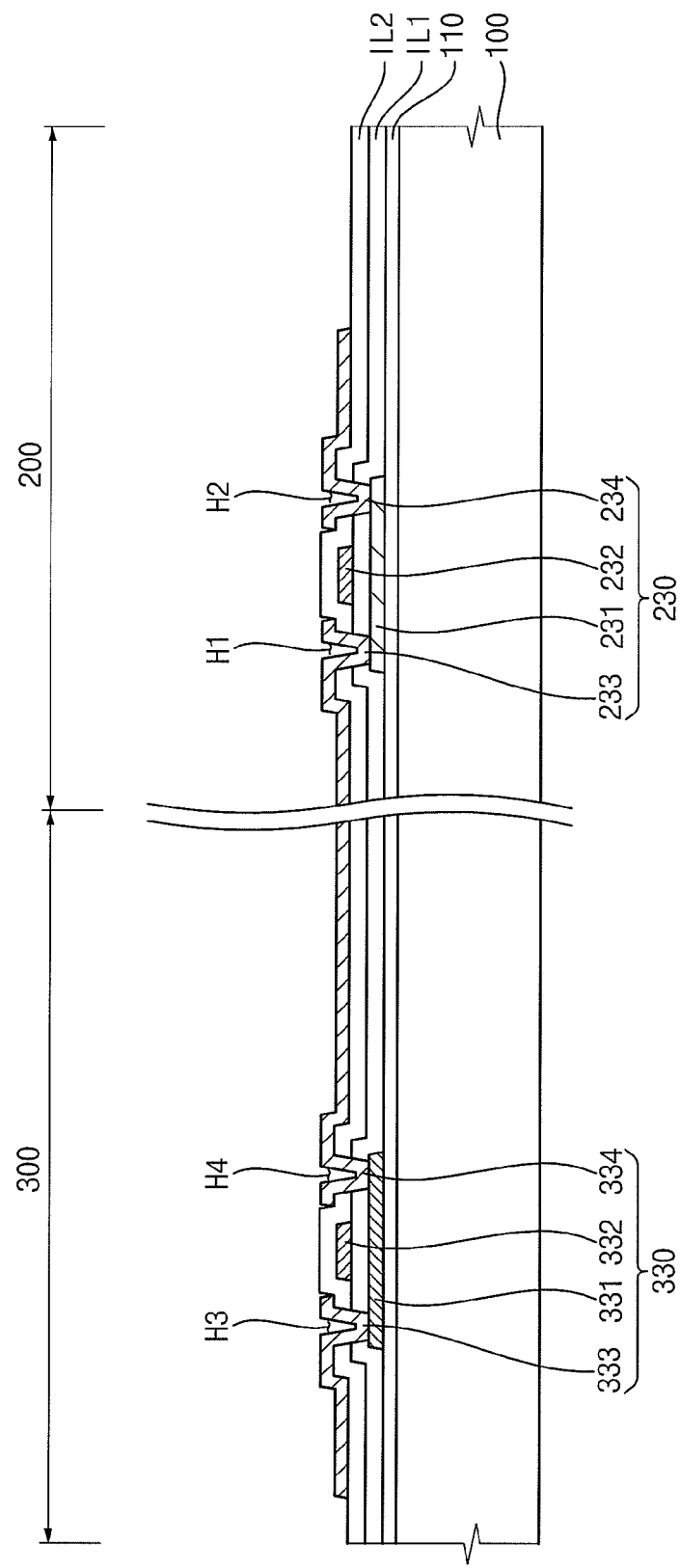

Referring to FIG. 3G, a metal layer (not shown) is formed on the second insulation layer IL2 where the first, second, third and fourth holes H1, H2, H3 and H4 are formed. A source metal pattern including the first source electrode 233, the second drain electrode 234, the second source electrode 333 and the second drain electrode 334 is formed by patterning the metal layer through photolithography and etching processes. The source metal pattern may include a plurality of data lines formed in the pixel area 200 and a plurality of circuit lines formed in the peripheral circuit area 300. A plurality of pixel parts are formed in the pixel area 200.

The first source electrode 233 is connected to the data line, and is formed in each of the pixel parts. The second source electrode 333 is connected to the circuit line, and is formed in the peripheral circuit area 300.

The first source electrode 233 is formed adjacent a first side of the first gate electrode 232. The first source electrode 233 is in contact with the first semiconductor layer 231 through the first hole H1.

The first drain electrode 234 is formed adjacent a second side of the first gate electrode 232. The first drain electrode 234 is in contact with the first semiconductor layer 231 through the second hole H2.

The second source electrode 333 is formed adjacent a first side of the second gate electrode 332. The second source electrode 333 is in contact with the second semiconductor layer 331 through the third hole H3. The second drain electrode 334 is formed adjacent the second gate electrode 332. The second drain electrode 334 is in contact with the second semiconductor layer 331 through the fourth hole H4.

Since ions are implanted into a semiconductor layer exposed by the first, second, third and fourth holes H1, H2, H3 and H4, the source and drain electrodes are in ohmic contact with the semiconductor layer.

The pixel area 200 includes the pixel TFT 230 having the first semiconductor layer 231, the first gate electrode 232, the first source electrode 233 and the first drain electrode 234. The peripheral circuit area 300 includes the circuit TFT 330 having the second semiconductor layer 331, the second gate electrode 332, the second source electrode 333 and the second drain electrode 334.

Since a crystallizing process of a semiconductor layer of the circuit TFT 330 is different from that of a semiconductor layer of the pixel TFT 230, driving characteristics of the circuit TFT 330 and the pixel TFT 230 may be different from each other.

Since the first semiconductor layer 231 crystallized by the SPC process may have uniform electron mobility, the pixel TFT 230 where the first semiconductor layer 231 functions as a channel of the pixel TFT 230 may have a stable and uniform threshold voltage Vth throughout the pixel area 200. Thus, a uniform image can be displayed throughout the pixel area 200 by using the first semiconductor layer 231 as a channel of the pixel TFT 230.

Since the second semiconductor layer 331 crystallized by the SPC and SLS processes may have excellent crystallinity, the electron mobility of the second semiconductor layer 331 is higher than that of the first semiconductor layer 231. Thus, a response time of the circuit TFT 330 may be enhanced by using the second semiconductor layer 331 as a channel of the circuit TFT 330.

Since the second semiconductor layer 331 having higher electron mobility is applied to the circuit TFT 330, system on glass (SOG) technology can be employed in the flat panel display device by directly forming the gate and data driving circuits on the substrate 100.

Referring to FIG. 3H, the third insulation layer IL3 is formed on the substrate 100 where the pixel TFT 230 and the circuit TFT 330 are formed. The third insulation layer IL3 may include, for example, silicon nitride SiNx or silicon oxide SiOx. The third insulation layer IL3 may be formed by a CVD process.

The contact hole CH is formed to expose a portion of the first drain electrode 234 by patterning the third insulation layer IL3 through photolithography and etching processes.

Referring to FIG. 3I, a transparent electrode layer (not shown) including a transparent conductive material is formed on the third insulation layer IL3. The transparent conductive material may include, for example, indium tin oxide ITO or indium zinc oxide IZO. The transparent conductive material may be formed by a sputtering process.

The first electrode 240 corresponding to each of the pixel parts is formed on the pixel area 200 by patterning the transparent electrode layer through photolithography and etching processes. The first electrode 240 is connected to the first drain electrode 234 through the contact hole CH. When the pixel TFT 230 is turned on, the pixel electrode 240 receives a pixel voltage from the first drain electrode 234.

In an exemplary embodiment, a color filter corresponding to each of the pixel parts may be formed before the first electrode 240 is formed. The color filter may include, for example, a photosensitive organic material having red, green and blue colors. The color filter may be patterned to correspond to each of the pixel parts through a photolithography process.

Figure 3J:
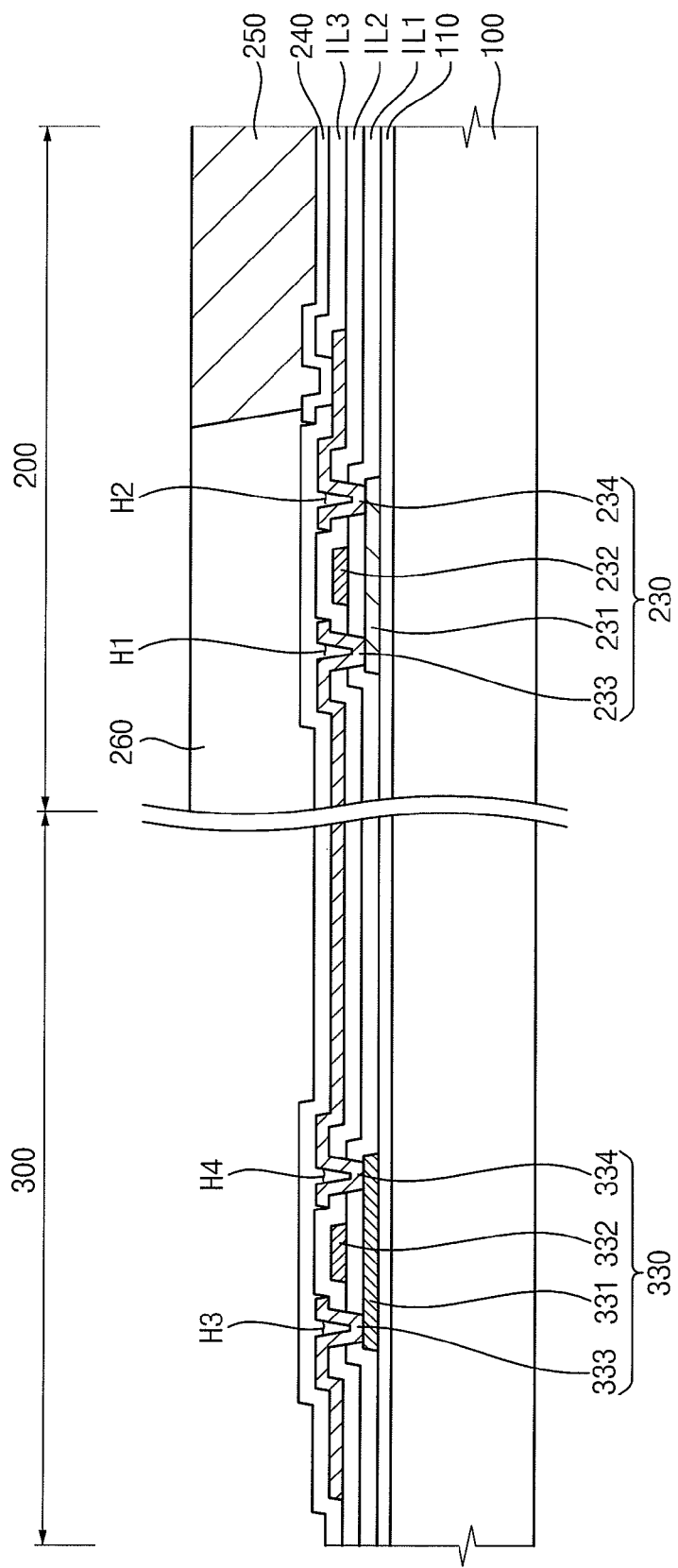

Referring to FIG. 3J, the bank part 260 is formed on the first electrode 240. The bank part 260 functions as a sidewall to divide the organic light emitting layer according to each of the pixel parts. In an exemplary embodiment, the bank part 260 is formed between the first electrodes 240 formed at each of the pixel parts, and has a constant height.

The bank part 260 may include, for example, an inorganic material having silicon dioxide $SiO_2$ or titanium dioxide $TiO_2$. The bank part 260 may be formed by a CVD process, a coating process, a sputtering process or a deposition process. The bank part 260 may include, for example, a heat-resistant or solvent-resistant material having acryl resin or polyimide resin. The bank part 260 may be patterned by a photolithography process.

The work function of the first electrode 240 is adjusted by activating treatment on a surface of the first electrode 240 and a surface of the bank part 260 through a plasma treatment process.

The organic light emitting layer 250 is formed in each of the pixel parts which is divided by the bank part 260. The organic light emitting layer 250 may include a hole injection layer, a hole transferring layer, a light emitting layer, an electron injection layer and an electron transferring layer.

The hole injection layer, the hole transferring layer, the light emitting layer, the electron injection layer and the electron transferring layer are formed by an ink-jet device or a deposition process.

Figure 3K:
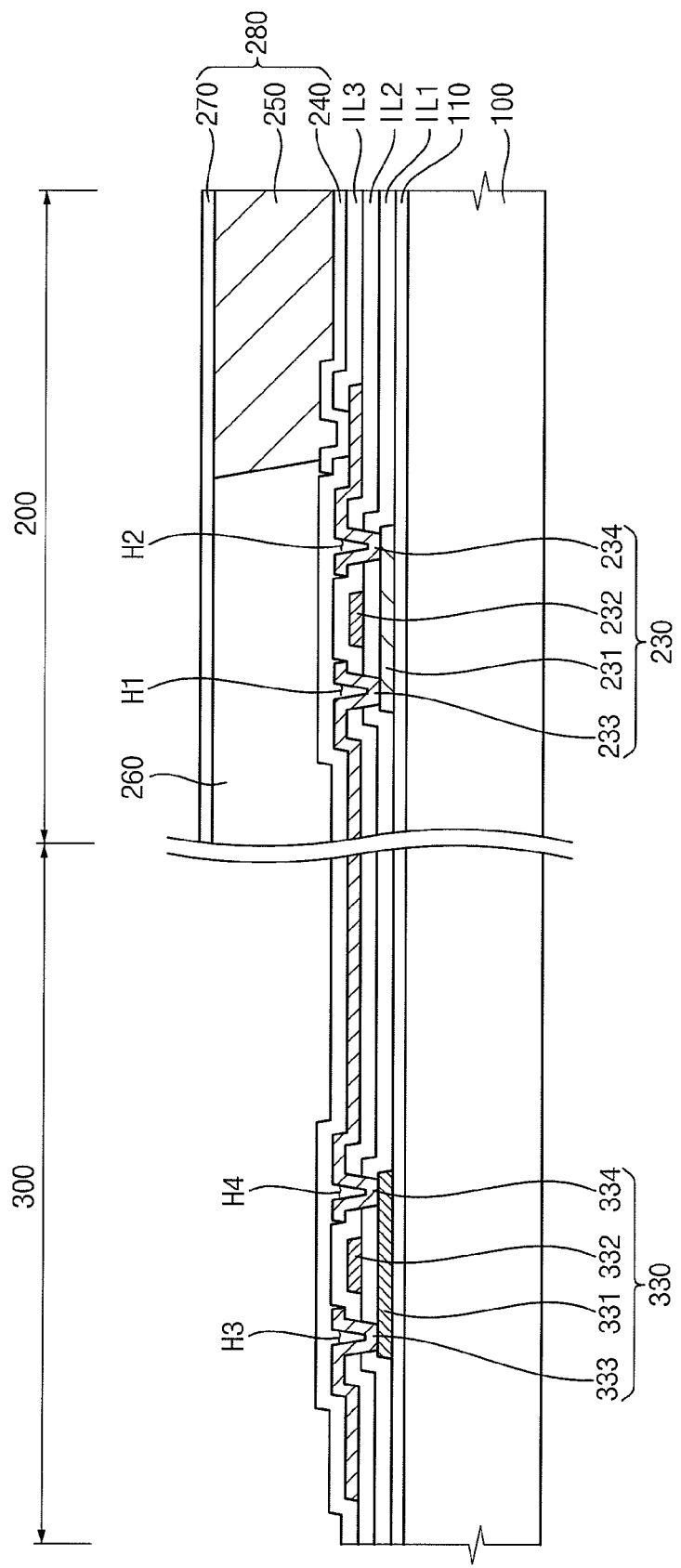

Referring to FIG. 3K, the second electrode 270 is formed on the pixel area 200 where the organic light emitting layer 250 is formed. The second electrode 270 may include a multi-layered structure having a plurality of materials.

In an exemplary embodiment, a portion adjacent to the organic light emitting layer 250 may include a material having a low work function. The material may include, for example, calcium (Ca), barium (Ba) or magnesium (Mg). The upper side portion may include a material having a higher work function than that of a lower side portion. The upper side portion may include, for example, aluminum (Al).

The second electrode 270 may include, for example, a transparent conductive material. When the second electrode 270 may include the transparent conductive material, the first electrode 240 may include a metal to reflect light.

In an exemplary embodiment, the second electrode 270 may be formed by a deposition process, a sputtering process or a CVD process. When the second electrode 270 is formed by the deposition process, the organic light emitting layer 250 may be protected by a heat treatment. The second electrode 270 receives a common voltage from the peripheral circuit area 300.

The organic light emitting diode 280 including the first electrode 240, the organic light emitting layer 250 and the second electrode 270 is formed on the substrate 100 to generate light.

A protection layer (not shown) may be formed throughout pixel area 200 where the second electrode 270 is formed. The protection layer protects the organic light emitting diode 280 from moisture or oxygen. The protection layer may be formed throughout the pixel area 200. In an exemplary embodiment, a protection substrate may be combined with the substrate 100 to protect the organic light emitting diode 280 by sealing the organic light emitting diode 280.

In a method of manufacturing a flat panel display device according to an exemplary embodiment of the present invention, a first crystallization using the SLS process and a second crystallization using the SPC process are performed sequentially. In an exemplary embodiment, a first crystallization using the SPC process and a second crystallization using the SLS process are performed sequentially.

Figure 4:
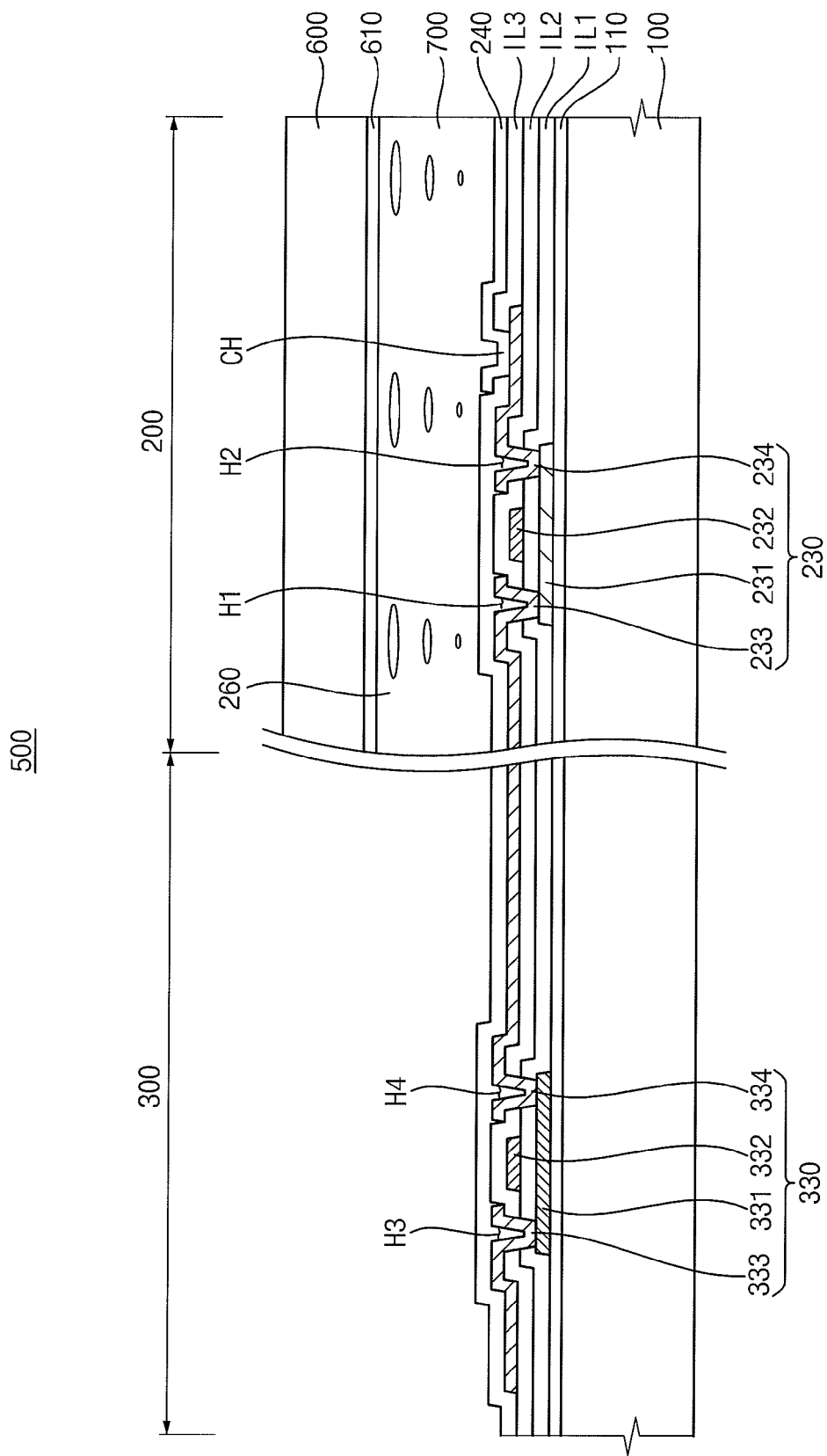
FIG. 4 is a cross-sectional view showing a flat panel display device according to an exemplary embodiment of the present invention.

FIG. 4 is a cross-sectional view showing a flat panel display device according to an exemplary embodiment of the present invention.

Referring to FIG. 4, a flat panel display device 500 according to an exemplary embodiment of the present invention includes a liquid crystal display device having a liquid crystal layer 700.

A countering substrate 600 is disposed on the substrate 100 including the first electrode 240. The countering substrate may have a smaller sized area than that of the substrate 100, and may be disposed to correspond to the pixel area 200.

A common electrode 610 including a transparent conductive material is formed on a surface of the countering substrate 600 which faces the substrate 100. The transparent conductive material may include, for example, indium tin oxide (ITO), indium zinc oxide (IZO) or amorphous indium tin oxide (a-ITO). The transparent conductive material may be formed by a sputtering process.

A color filter (not shown) corresponding to each of the pixel parts may be formed under the common electrode 610.

The liquid crystal layer 700 is interposed between the substrate 100 and the countering substrate 600. A light supplying unit may be disposed at a front side or a rear side of the substrate 100 to supply light toward the substrate 100.

An arrangement of liquid crystal molecules of the liquid crystal layer 700 varies according to an electric filed formed between the first electrode 240 and the common electrode 610. Since light provided form the light supplying unit passes through the liquid crystal layer 700, an image is displayed toward the countering substrate 600.

A method of manufacturing flat panel display device 500 is substantially the same as the embodiment shown in FIGS. 3A to 3I.

A sealing member (not shown) is coated on the substrate 100 where the first electrode 240 is formed to surround the pixel area 200. The sealing member may be partially coated to open a liquid crystal injection portion.

The countering substrate 600 where the common electrode 610 is formed is disposed on the substrate 100 where the sealing member is coated.

The countering substrate 600 may have a smaller sized area than that of the substrate 100 to correspond to the pixel area 200. The countering substrate 600 is coupled with the substrate 100 by the sealing member.

After the liquid crystal layer 700 is injected through the liquid crystal injection portion between the substrate 100 and the countering substrate 200, the liquid crystal injection portion is sealed.

Since the first semiconductor layer crystallized by the SPC process may have uniform electron mobility, an image can be displayed uniformly throughout the pixel area by using the first semiconductor layer as a channel of the pixel TFT.

Since the response time of the circuit TFT is enhanced by using the polysilicon crystallized by the SLS process as the second semiconductor layer.

The circuit TFT can improve response time by using the second semiconductor layer as a channel of the circuit TFT.

Semiconductor layers crystallized by different crystallization process can be employed for the circuit TFT and the pixel TFT to satisfy the driving characteristics used for the circuit TFT and the pixel TFT.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of manufacturing a flat panel display device, the method comprising:
   forming a semiconductor layer including amorphous silicon on a substrate having a pixel area and a peripheral circuit area surrounding the pixel area;
   first crystallizing the semiconductor layer formed on the peripheral circuit area through a sequential lateral solidification (SLS) process;
   second crystallizing the semiconductor layer formed on the peripheral circuit area and the pixel area through a solid phase crystallization (SPC) process;
   forming a circuit thin film transistor (TFT) including the semiconductor layer crystallized by the first crystallizing and second crystallizing, wherein the circuit TFT is formed in the peripheral circuit area;

forming a pixel TFT including the semiconductor layer crystallized by the second crystallizing, wherein the pixel TFT is formed in the pixel area; and forming a first electrode connected to the pixel TFT, wherein first crystallizing and second crystallizing are performed successively with each other.

2. The method of claim 1, wherein the second crystallizing is performed after the first crystallizing.

3. The method of claim 1, wherein the first crystallizing is performed after the second crystallizing.

4. The method of claim 1, further comprising: forming an organic light emitting layer on the first electrode; and forming a second electrode on the organic light emitting layer corresponding to the pixel area.

5. The method of claim 4, wherein the pixel area comprises a plurality of pixel parts and the first electrode corresponding to each of the pixel parts.

6. The method of claim 1, wherein the first crystallizing using the SLS process comprises:

irradiating a laser beam onto a slit mask corresponding to a first portion of the peripheral circuit area to crystallize a portion of the semiconductor layer;

shifting the slit mask at a predetermined distance in the peripheral circuit area; and irradiating a laser beam onto the shifted slit mask to crystallize a second portion of the peripheral circuit area.

7. The method of claim 1, wherein the second crystallizing using the SPC process is performed at a heat-treatment temperature in a range of from about 600° C. to about 1000° C.

8. The method of claim 1, further comprising: forming a color filter between the pixel TFT and the first electrode.

9. The method of claim 1, further comprising: coupling a countering substrate with the substrate; and injecting a liquid crystal layer between the substrate and the countering substrate.

10. The method of claim 9, further comprising: forming a common electrode on a surface of the countering substrate that faces the substrate.

* * * * *